United States Patent
Chen

(10) Patent No.: US 7,841,837 B2
(45) Date of Patent: Nov. 30, 2010

(54) COOLING-FAN ROTATION-SPEED CONTROL CIRCUIT

(75) Inventor: Tsung-Chun Chen, Taipei Hsien (TW)

(73) Assignee: Zippy Technology Corp., Taipei Hsien (TW)

( * ) Notice: Subject to any disclaimer, the term of this patent is extended or adjusted under 35 U.S.C. 154(b) by 970 days.

(21) Appl. No.: 11/505,478

(22) Filed: Aug. 17, 2006

(65) Prior Publication Data

US 2008/0042603 A1    Feb. 21, 2008

(51) Int. Cl.
 F04B 49/00    (2006.01)
 H02P 7/00     (2006.01)
 G05D 23/19    (2006.01)

(52) U.S. Cl. .......................... 417/14; 417/32; 417/326; 307/75; 307/139; 318/473; 388/934

(58) Field of Classification Search .................. 417/32, 417/42, 14, 423.1, 16, 17, 326; 307/11, 34, 307/75; 388/833, 934; 318/472, 473
See application file for complete search history.

(56) References Cited

U.S. PATENT DOCUMENTS

| | | | | |
|---|---|---|---|---|
| 3,853,174 A * | 12/1974 | Kramer | ...................... | 165/287 |
| 4,323,192 A * | 4/1982 | Jackson | .................... | 236/46 R |
| 4,352,635 A * | 10/1982 | Saunders | ..................... | 417/16 |
| 4,651,922 A * | 3/1987 | Noba | .......................... | 236/35 |
| 4,806,832 A * | 2/1989 | Muller | ........................ | 388/833 |
| 5,049,801 A * | 9/1991 | Potter | ......................... | 318/785 |
| 5,698,908 A * | 12/1997 | Pollmeier et al. | ............. | 307/44 |
| 5,962,933 A * | 10/1999 | Henderson et al. | .......... | 307/126 |
| 5,990,582 A * | 11/1999 | Henderson et al. | .......... | 307/139 |
| 6,172,476 B1 * | 1/2001 | Tolbert et al. | ................ | 318/772 |
| 6,265,790 B1 * | 7/2001 | Vogman | ....................... | 307/64 |
| 6,368,064 B1 * | 4/2002 | Bendikas et al. | ............... | 417/2 |
| 6,390,379 B1 * | 5/2002 | Huang | ....................... | 236/49.3 |
| 6,400,045 B1 * | 6/2002 | Hosokawa et al. | .......... | 307/117 |
| 6,583,523 B1 * | 6/2003 | Bhate | .......................... | 307/86 |
| 6,735,704 B1 * | 5/2004 | Butka et al. | ................. | 713/300 |
| 6,747,369 B2 * | 6/2004 | Griffith et al. | ................. | 307/43 |
| 6,768,225 B2 * | 7/2004 | Chang et al. | ................... | 307/65 |
| 6,922,038 B2 * | 7/2005 | Horng et al. | ................ | 318/825 |
| 6,956,344 B2 * | 10/2005 | Robertson et al. | .......... | 318/538 |
| 7,145,265 B2 * | 12/2006 | Mc Nulty et al. | ............. | 307/44 |
| 7,538,453 B1 * | 5/2009 | Roux et al. | .................... | 307/86 |
| 2003/0122438 A1 * | 7/2003 | Winkel et al. | ............... | 310/112 |
| 2003/0193307 A1 * | 10/2003 | Burstein | ..................... | 318/473 |

(Continued)

FOREIGN PATENT DOCUMENTS

EP    1508754    *    2/2005

(Continued)

*Primary Examiner*—Devon C Kramer
*Assistant Examiner*—Nathan Zollinger
(74) *Attorney, Agent, or Firm*—Muncy, Geissler, Olds & Lowe, PPLC

(57) ABSTRACT

The present invention discloses a cooling-fan rotation-speed control circuit, wherein a plurality of sets of input power sources respectively having different voltages is electrically and parallel coupled to a cooling fan; a switch is installed between at least one input power source and the cooling fan; the switch is turned on/off according to a rotation-speed parameter to determine whether the cooling fan is driven by a low-voltage driving power or a high-voltage driving power.

7 Claims, 6 Drawing Sheets

U.S. PATENT DOCUMENTS

2005/0084384 A1 * 4/2005 Delano et al. .................. 417/42

FOREIGN PATENT DOCUMENTS

| TW | 420326 A | 1/2001 |
|---|---|---|
| TW | 527090 A | 4/2003 |
| TW | 545624 A | 8/2003 |
| TW | M241884 U | 8/2004 |
| TW | M250225 U | 11/2004 |

* cited by examiner

COOLING-FAN ROTATION-SPEED CONTROL CIRCUIT

FIELD OF THE INVENTION

The present invention relates to a cooling-fan rotation-speed control circuit, particularly to a control circuit, which integrates the automatic detection mode and the switch-operation mode and determines the driving power level and the rotation speed of a cooling fan via turning on/off a switch according to a rotation-speed parameter.

BACKGROUND OF THE INVENTION

With the advance of technology, the volume of an electronic device is growing smaller and smaller. However, the performance thereof is growing higher and higher. Thus, the heat-dissipation problem and the design of the cooling fans of electronic devices become critical. In addition to the cooling capability, the designers of cooling fans also have to consider the noise caused by the vibration or the wind shear of high-speed rotation because users cannot accept too much noise. Therefore, the balance between the rotation speed and the noise becomes a key point in designing cooling fans.

As to the control modes of the cooling fans of electronic devices, they may be divided into the manual type and the automatic type. Refer to R.O.C. Patent Publication Nos. 527090 and 545624 for the manual type control mode. Refer to R.O.C. Patent Publication No. 420326, and Patent Nos. M241884 and M250225 for the automatic type control mode. Either of the manual type and the automatic type control modes can be schematically shown with FIGS. 1 and 2. For the conventional control modes proposed in patents or used in products, a temperature-detection element 11 (such as a thermistor) is used to continuously detect the ambient temperature inside an electronic device 50 and then acquire the temperature-variation coefficient; next, the driving power for a cooling fan 40 is modified via the intrinsic impedance variation of the temperature-detection element 11 or the impedance variation of the resistor of the shunt circuit; then, different driving powers generate different rotation speeds of the cooling fan 40. The relationship between the temperature and the rotation speed is commonly linear and like that shown in FIG. 1. However, such a control mode has disadvantages. For example, when the cooling fan 40 is installed inside the power supply of a computer, in addition to the heat generated by the power supply itself, the cooling fan 40 usually has to drive out the heat flows generated by other electronic devices 50 inside the computer (such as CPU and hard drives) also. The location of the power supply together with the locations and quantities of other electronic devices 50 will influence the direction and temperature of the air current of the cooling fan 40 and also influence the cooling capability and the noise caused by wind shear. Owing to the linear impedance variation and the impedance attenuation of the temperature-detection element 11, the manufacturers are hard to appropriately arrange the location of the power supply to achieve a well balance between the rotation speed and the noise. Further, the cooling fans 40 are driven by a single input power source 10 in the conventional technology. When the temperatures of the heat flows of other electronic devices 50 of the computer are too high, the temperature-detection element 11 will detect the high-temperature heat flows of other electronic devices 50, and the cooling fan 40 inside the power supply will thus constantly operate at a high speed. Such a phenomenon not only occurs in the cooling fan 40 of the power supply but also occurs in all the cooling fans 40 inside the computer, i.e. after the computer has operated for a period of time, almost all the cooling fans 40 operate at high speed. Such a case generates high noise, which is unwelcome in the market.

SUMMARY OF THE INVENTION

The primary objective of the present invention is to provide a cooling-fan rotation-speed control circuit to overcome the abovementioned problems, wherein a plurality of input power sources respectively having different voltages is electrically and parallel coupled to a cooling fan; at least one switch is installed between at least one input power source and the cooling fan; the switch is turned on/off according to a rotation-speed parameter to determine whether the cooling fan is driven by a lower-voltage driving power or a high-voltage driving power. In the present invention, the relationship between the cooling-fan rotation speed and the rotation-speed parameter (such as the ambient-temperature coefficient) is definitely established, and the spatial configuration of electronic devices can thus be well arranged according to the relationship.

Another objective of the present invention is to provide a cooling-fan rotation-speed control circuit, wherein the cooling fan is driven by a voltage-regulated DC input power source in every rotation-speed state. Therefore, via the present invention, the cooling fan is free from the conventional problem of the driving voltage fluctuation caused by the impedance attenuation of the temperature-detection element (such as a thermistor).

Further objective of the present invention is to provide a cooling-fan rotation-speed control circuit, wherein the input voltage level is determined according to a rotation-speed parameter with a switch-operation mode; in addition to the automatic temperature-detection mode, the power-performance coefficient, which is acquired from the performance of electronic devices with an electronic circuit, may also be used as the rotation-speed parameter; when a temperature-detection mode is used, independent temperature-detection elements are arranged in the electronic elements really generating heat inside the electronic devices so that each cooling fan can operate at the rotation speed the corresponding electronic device really needs; and the cooling fans of the electronic devices can thus be independently controlled.

DETAILED DESCRIPTION OF THE PREFERRED EMBODIMENTS

The technical contents of the present invention are to be described in detail in cooperation with the drawings below.

Figure 1:
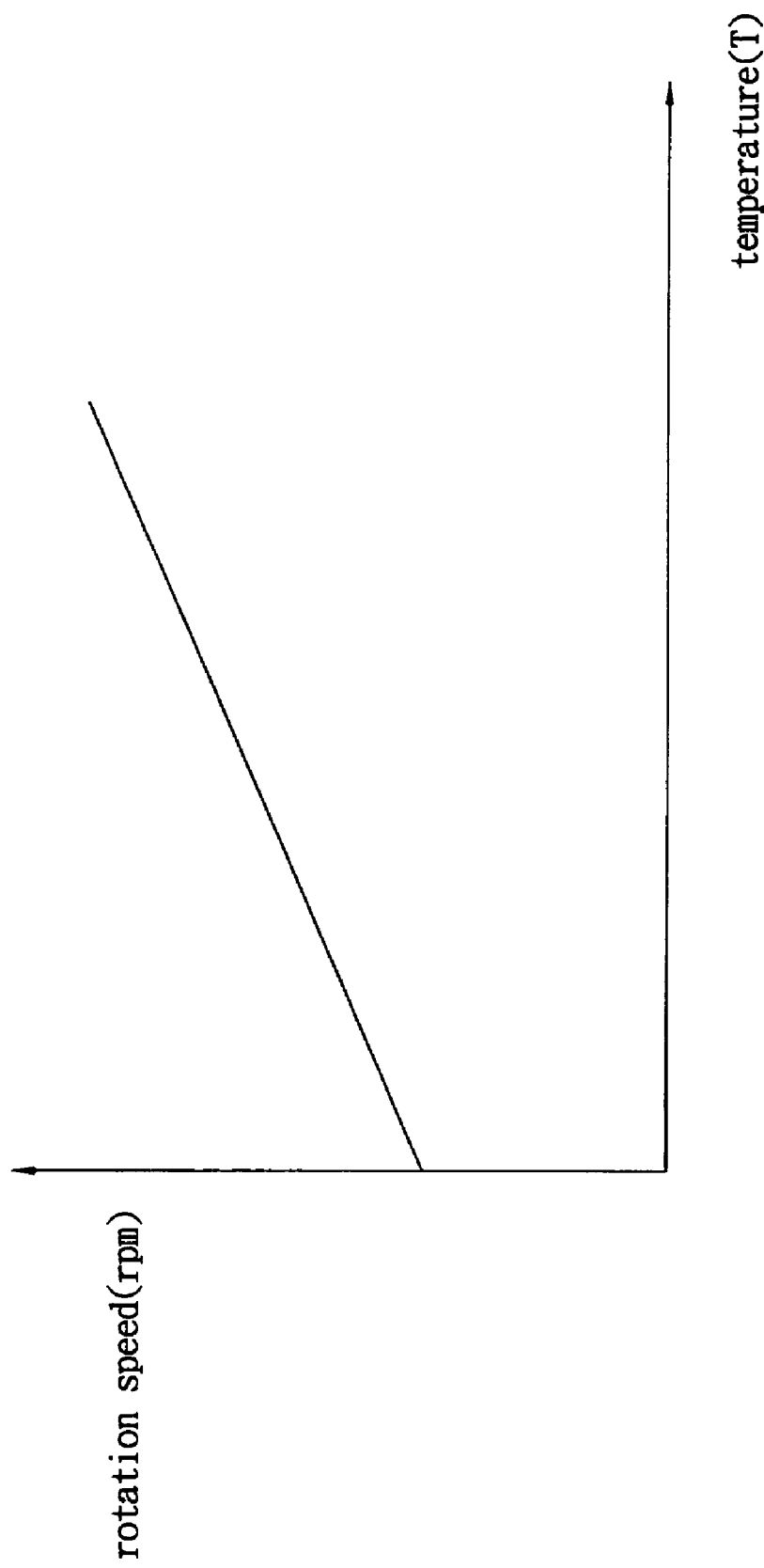
FIG. 1 is a diagram schematically showing the conventional relationship between the temperature and the cooling-fan rotation speed.
Figure 2:
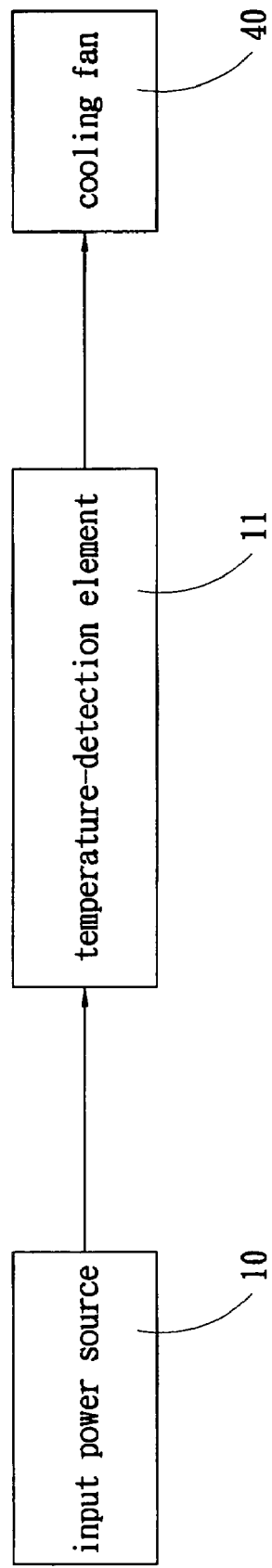
FIG. 2 is a block diagram schematically showing the conventional cooling-fan rotation-speed control circuit.
Figure 3:
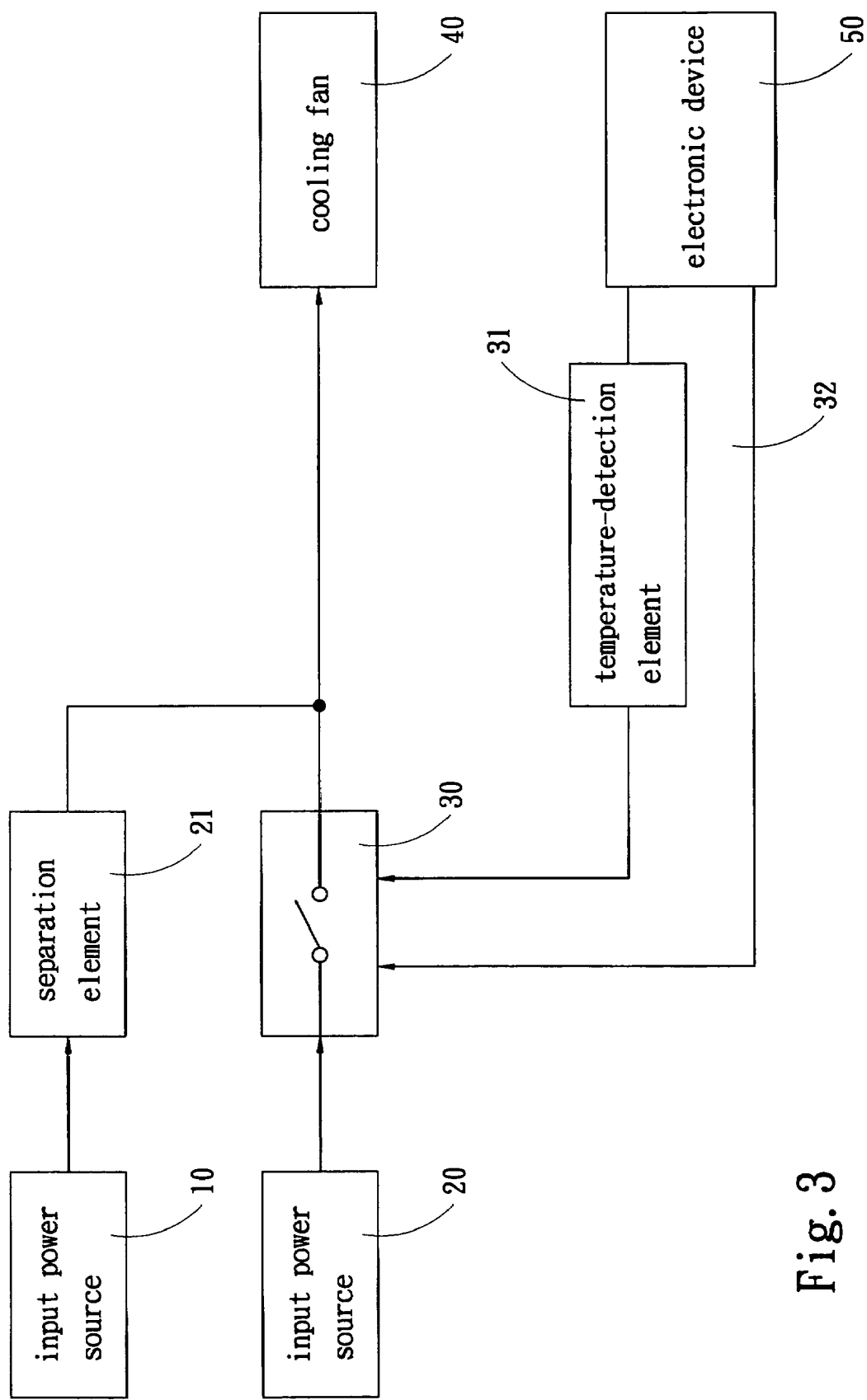
FIG. 3 is a block diagram schematically showing the cooling-fan rotation-speed control circuit according to one embodiment of the present invention.
Figure 5:
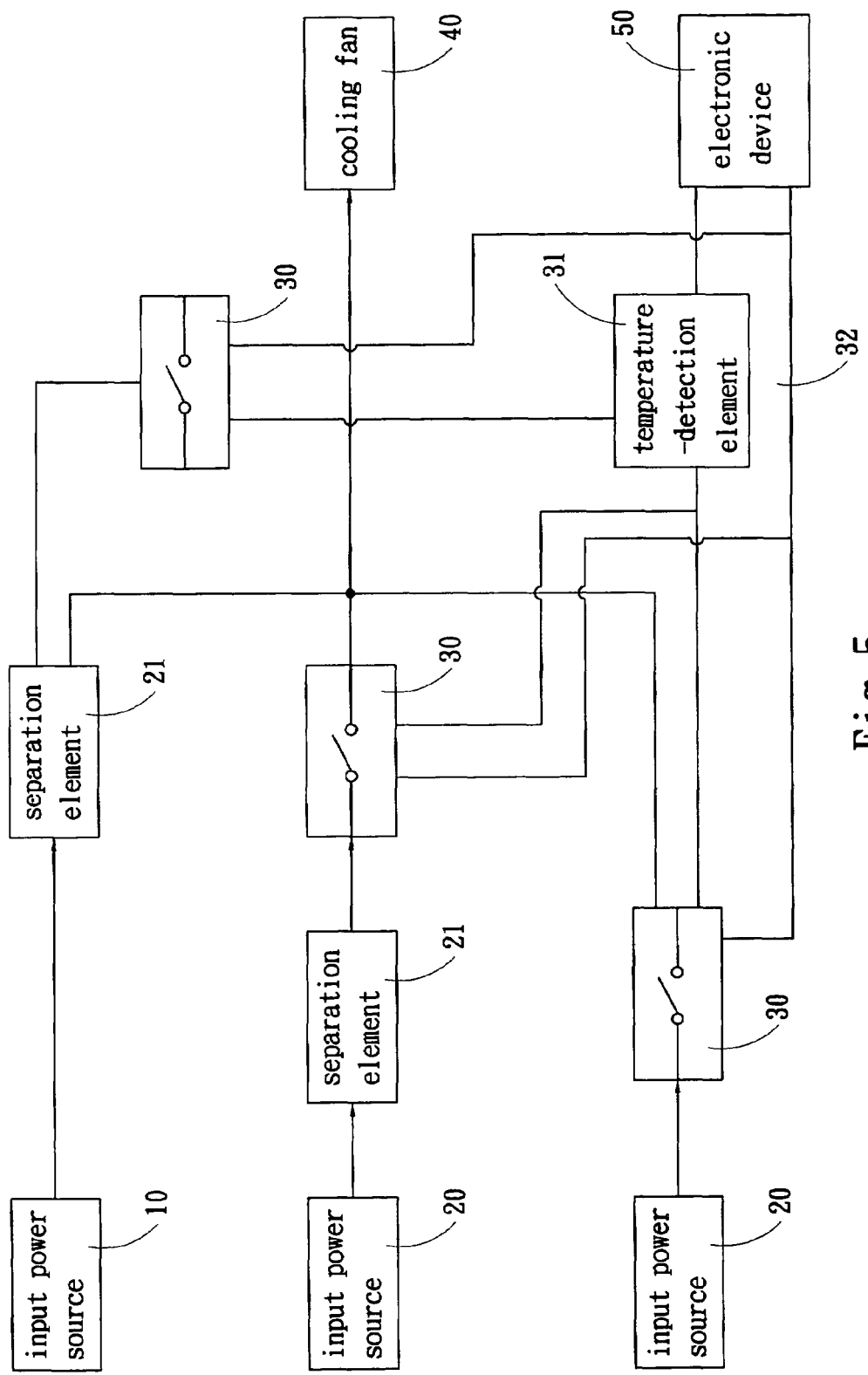
FIG. 5 is a block diagram schematically showing the cooling-fan rotation-speed control circuit according to another embodiment of the present invention.

Refer to FIG. 3 a block diagram schematically showing the cooling-fan rotation-speed control circuit according to the present invention. As shown in FIG. 3, the cooling-fan rotation speed control circuit of the present invention is used to determine the rotation speed of at least one cooling fan 40 and has at least two input power sources 10 and 20. The input power sources 10 and 20 have different voltage levels and are electrically coupled to the cooling fan 40 and provide power to drive the cooling fan 40 respectively. The input power sources 10 and 20 are voltage-regulated DC power output by a power supply. In the embodiment shown in FIG. 3, there are two input power sources 10 and 20; in the embodiment shown in FIG. 5, there are three input power sources 10 and 20. At least one switch 30 is disposed between at least one input power source 20 and the cooling fan 40. A separation element 21 (such as a diode) is disposed between the low-voltage input power source 10 and the cooling fan 40 and used to prevent the current of the high-voltage input power source 20 from flowing adversely to the low-voltage input power source 10. The switch 30 is turned on/off according to a rotation-speed parameter to determine whether the cooling fan 40 is driven by the high-voltage input power source or the lower-voltage input power source. The rotation-speed parameter may be an ambient-temperature coefficient or a power-performance coefficient. When the rotation-speed parameter is an ambient-temperature coefficient, the switch 30 is coupled to a temperature-detection element 31 to acquire the ambient-temperature coefficient. When the rotation-speed parameter is a power-performance coefficient, the switch 30 is coupled to a detection circuit 32 to acquire the power-performance coefficient, wherein the power-performance coefficient can reflect the physical operation condition (such as the under-load state, the heavy-load state or the over-load state) of the electronic device 50 and may be expressed with watt-hour, voltage, current or another parameter.

In the embodiment shown in FIG. 3, only the high-voltage input power source 20 is equipped with the switch 30. In the embodiment shown in FIG. 5, all the input power sources 10 and 20 are equipped with the switches 30, wherein the voltages V1, V2 and V3 of the input power sources 10 and 20 are defined to be V3>V2>V1.

Figure 4:
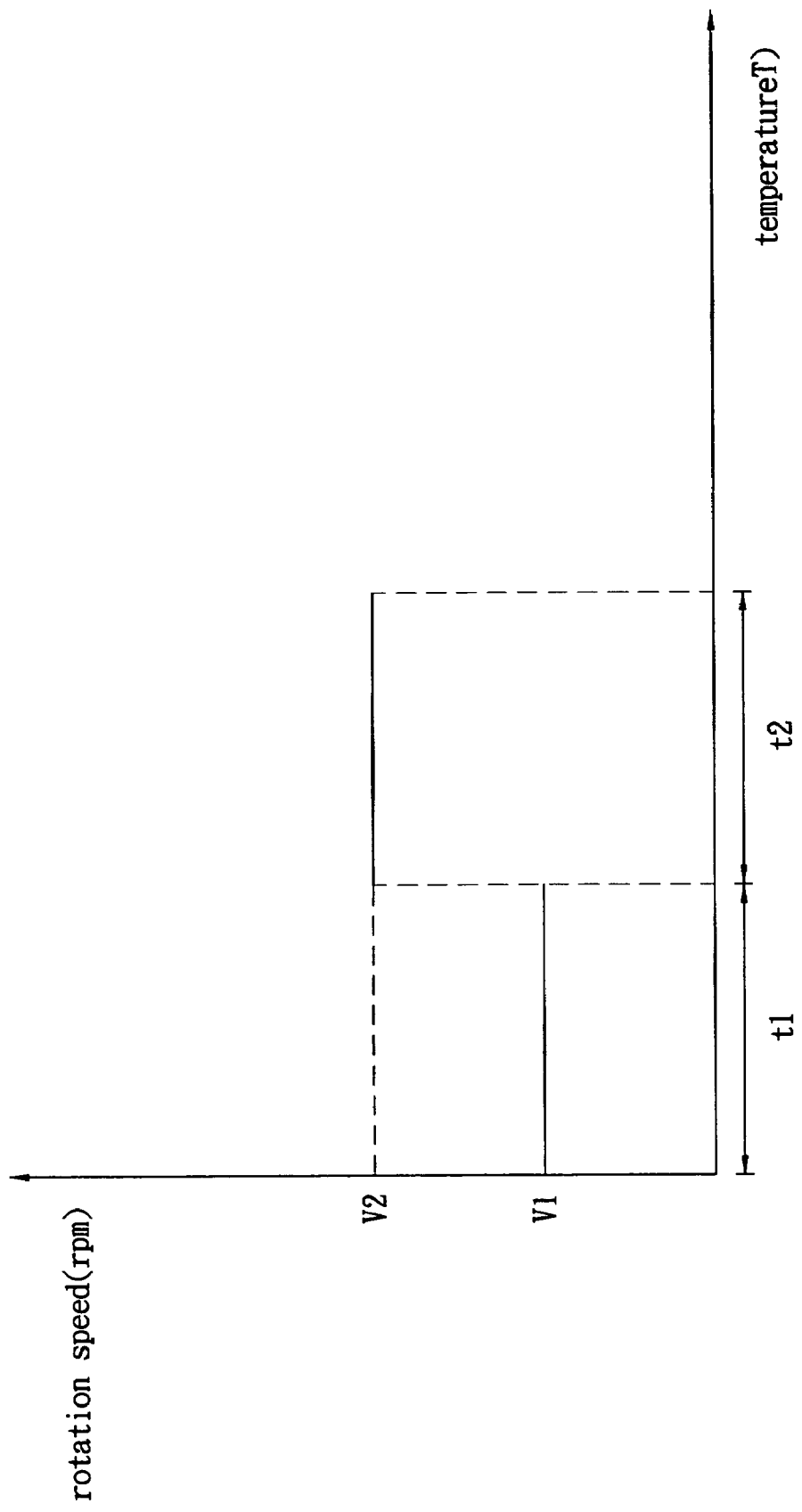
FIG. 4 is a diagram schematically showing the relationship between the temperature and the cooling-fan rotation speed of the control circuit shown in FIG. 3.
Figure 6:
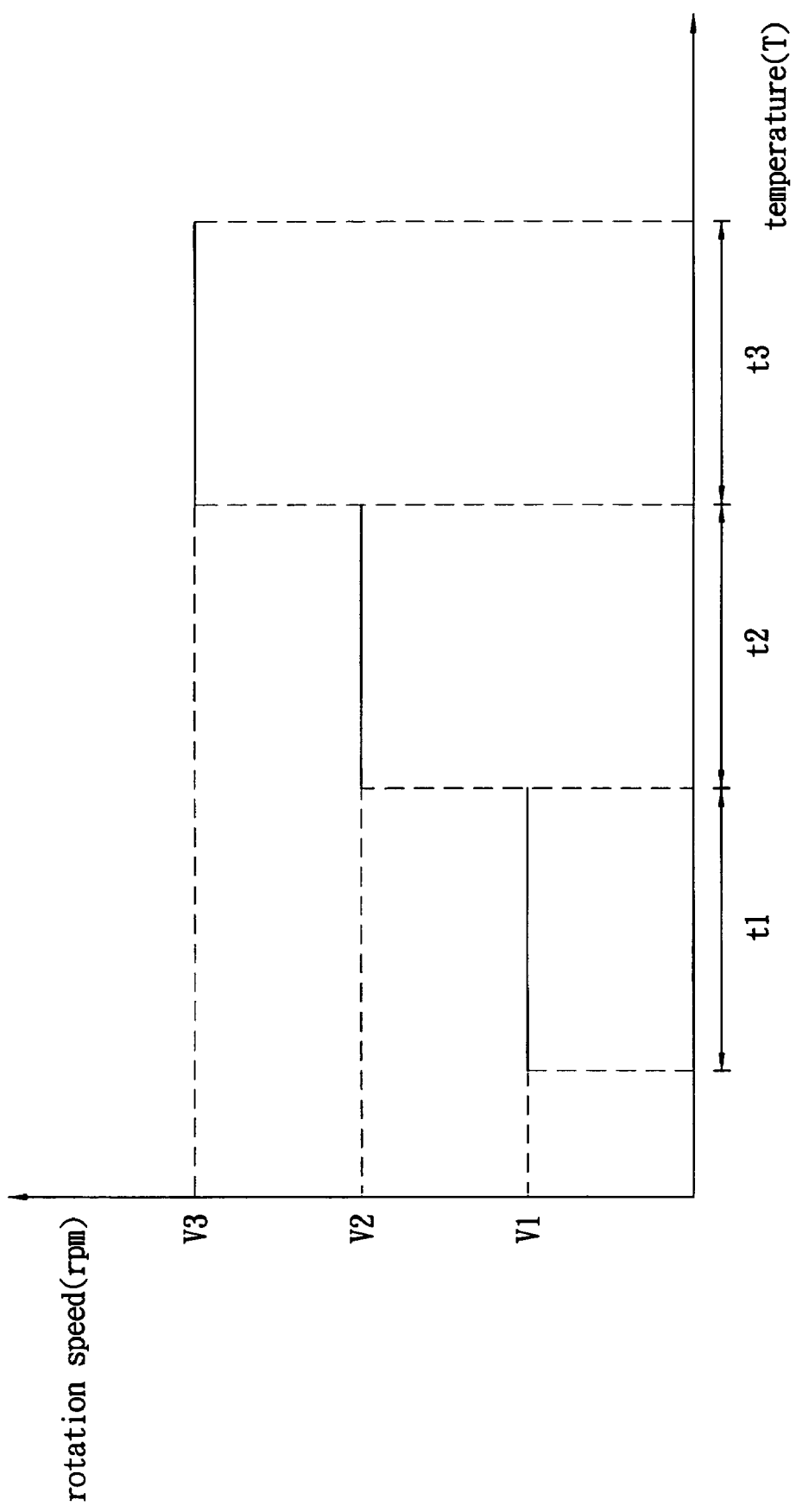
FIG. 6 is a diagram schematically showing the relationship between the temperature and the cooling-fan rotation speed of the control circuit shown in FIG. 5.

Refer to FIGS. 4 and 6, wherein the embodiments using the ambient-temperature as the rotation-speed parameter are used to exemplify the present invention. According to the present invention, the temperature threshold values for shifting the switches 30 or the temperature ranges (t1, t2 and t3) for shifting the switches 30 are respectively established for the switches 30. Thus, the user can definitely acquire the physical rotation speeds of the cooling fans 40 for different temperature ranges and the values of the noise caused by vibration or wind shear at different rotation speeds. Thereby, the user can determine the directions of air currents when he configures the cooling fans 40, and the user can also achieve an optimized balance between the cooling capability and the noise when he respectively configures the cooling conditions for the heat sources of the electronic devices 50. It is to be noted that for the cooling fan 40 of each electronic device 50, the rotation speeds corresponding to the switches 30 may be independently preset according to the temperature-rising condition and the temperature durability of the electronic device 50. If the temperature durability of the location where one electronic device 50 accumulates heat is higher, or if the air current effect is well at the location where one cooling fan 40 is placed, the cooling fan 40 may be preset to not operate until it reaches a specified temperature (such as below 40□). In contrast to the conventional control mode that a basic power source is used and then adjusted, the present invention can really independently control the cooling fan 40 of each electronic device 50 and can achieve a superior balance between the cooling capability and the noise.

Those described above are the preferred embodiments to exemplify the present invention. However, it is not intended to limit the scope of the present invention, and any equivalent modification and variation according to the spirit of the present invention is to be also included within the scope of the present invention.

What is claimed is:

1. A cooling-fan control circuit, used to determine the rotation speed of at least one cooling fan, said control circuit comprising:
    at least two separate input power sources that provide power to drive said cooling fan, said input power sources including a low-voltage input power source and at least one high-voltage input power source which supply electric current to said cooling fan through separate power-providing lines, said low-voltage input power source being electrically coupled to said cooling fan continuously;
    a separation element installed between said low-voltage input power source and said cooling fan; and
    a switch installed on at least one power-providing line between at least one said high-voltage input power source and said cooling fan, acquiring a rotation-speed parameter to determine the on/off setting of said switch and thereby determine whether said cooling fan is driven by the low-voltage input power source or one of the high-voltage input power sources according to said rotation-speed parameter.

2. The cooling-fan rotation speed control circuit according to claim 1, wherein said separation element is a diode.

3. The cooling-fan rotation speed control circuit according to claim 1, wherein said rotation-speed parameter is an ambient-temperature coefficient.

4. The cooling-fan rotation speed control circuit according to claim 3, wherein said switch is coupled to a temperature-detection element, which can acquire said ambient-temperature coefficient.

5. The cooling-fan rotation speed control circuit according to claim 1, wherein said rotation-speed parameter is a power-performance coefficient.

6. The cooling-fan rotation speed control circuit according to claim 5, wherein said switch is coupled to a detection circuit for acquiring said power-performance coefficient.

7. The cooling-fan rotation speed control circuit according to claim 1, wherein said input power sources are voltage-regulated DC powers output by a power supply.

* * * * *